(12) United States Patent
Igarashi

(10) Patent No.: US 7,572,523 B2
(45) Date of Patent: Aug. 11, 2009

(54) ORGANIC ELECTROLUMINESCENT DEVICE

(75) Inventor: Tatsuya Igarashi, Kanagawa (JP)

(73) Assignee: Fujifilm Corporation, Tokyo (JP)

( * ) Notice: Subject to any disclaimer, the term of this patent is extended or adjusted under 35 U.S.C. 154(b) by 707 days.

(21) Appl. No.: 11/109,804

(22) Filed: Apr. 20, 2005

(65) Prior Publication Data

US 2005/0238918 A1    Oct. 27, 2005

(30) Foreign Application Priority Data

Apr. 21, 2004    (JP)    ............................... 2004-125584

(51) Int. Cl.
*H01L 51/54*    (2006.01)

(52) U.S. Cl. ........................ 428/690; 428/917; 313/504; 313/506

(58) Field of Classification Search .................. 313/504, 313/506

See application file for complete search history.

(56) References Cited

U.S. PATENT DOCUMENTS

| 6,310,360 | B1 * | 10/2001 | Forrest et al. ................. 257/40 |
| 2002/0197511 | A1 * | 12/2002 | D'Andrade et al. ......... 428/690 |
| 2005/0168137 | A1 * | 8/2005 | Adamovich et al. ......... 313/504 |
| 2006/0125379 | A1 * | 6/2006 | Liu et al. ..................... 313/504 |

FOREIGN PATENT DOCUMENTS

WO    WO-00/70655 A2    11/2000

* cited by examiner

*Primary Examiner*—Dawn Garrett
(74) *Attorney, Agent, or Firm*—Birch, Stewart, Kolasch & Birch, LLP

(57) ABSTRACT

An organic electroluminescent device including a pair of electrodes and at least one organic compound layer including a luminescent layer between the pair of electrodes, in which the luminescent layer contains at least one host material and at least one phosphorescent material, and the concentration of the phosphorescent material changes periodically in the depth direction of the luminescent layer.

12 Claims, No Drawings

ORGANIC ELECTROLUMINESCENT DEVICE

CROSS-REFERENCE TO RELATED APPLICATION

This application claims priority under 35 USC 119 from Japanese Patent Application No. 2004-125584, the disclosure of which is incorporated by reference herein.

BACKGROUND OF THE INVENTION

1. Field of the Invention

The present invention relates to an organic electroluminescent element capable of luminescence by converting electric energy to light.

2. Description of the Related Art

Organic electroluminescent (EL) elements have attracted attention as a promising display device, since they can provide luminescence having high brilliance at a low voltage. One of the important characteristic values of the organic electroluminescent devices is external quantum efficiency. External quantum efficiency is calculated from the following formula:

External quantum efficiency $\phi$=(number of photons emitted from device)/(number of electrons injected to device)

As the value increases, the device becomes advantageous in view of power consumption.

Specifically, the external quantum efficiency of the organic electroluminescent device is determined by the following formula.

External quantum efficiency $\phi$=(internal quantum efficiency)×(light extraction efficiency)

The threshold value of the internal quantum efficiency of organic EL devices utilizing fluorescent light emitted from an organic compound is 25%, and the light extraction efficiency thereof is about 20%. Therefore, the threshold value of the external quantum efficiency thereof is thought to be about 5%.

An organic electroluminescent device including a triplet luminescent material (phosphorescent material) has been reported as an organic electroluminescent device which has an improved internal quantum efficiency, and in turn an improved external quantum efficiency (for example, see WO 2000/070655). The external quantum efficiency of this device can be much higher than that of a conventional device utilizing emission of fluorescent light (singlet luminescent device), and the maximum value of external quantum efficiency of the device reaches 8% (external quantum efficiency at 100 cd/m$^2$ is 7.5%). However, the durability (excellent durability of luminescence) is not sufficient. An organic electroluminescent device which has both high efficiently and high durability has been demanded.

SUMMARY OF THE INVENTION

The present invention has been made in view of the above circumstances, and provides an organic electroluminescent device.

An aspect of the invention is to provide an organic electroluminescent device comprising a pair of electrodes and at least one organic compound layer including a luminescent layer between the pair of electrodes, in which the luminescent layer contains at least one host material and at least one phosphorescent material, and the concentration of the phosphorescent material changes periodically in a depth direction of the luminescent layer.

DETAILED DESCRIPTION OF THE INVENTION

The present invention is described in detail below.

The organic electroluminescent device of the invention is an organic electroluminescent device including at least one organic compound layer including a luminescent layer between a pair of electrodes. The luminescent layer contains at least one host material and at least one phosphorescent material, and the concentration of the phosphorescent material changes periodically in the depth direction of the luminescent layer.

The phosphorescent material is a compound having a function of emitting phosphorescent light in an organic electroluminescent device. The phosphorescent material used in the invention is not particularly specified, but a transition metal complex is preferable.

The transition metal in the transition metal complex is not particularly specified. The transition metal is preferably platinum, iridium, palladium, rhodium, rhenium, ruthenium, or copper, more preferably platinum, iridium or rhenium, still more preferably platinum or iridium, and particularly preferably iridium.

Specific examples of the transition metal complex include various compounds disclosed in publications such as U.S. Pat. No. 6,303,238B1, WO 00/57676, WO 00/70655, WO 01/08230, WO 01/41512, WO 01/02714, WO 02/15645, WO 02/45466, Japanese Patent Application Laid-Open (JP-A) No. 2001-247859, JP-A No. 2001-189539, JP-A No. 2002-235076, and JP-A No. 2002-170684, the disclosures of which are incorporated by reference herein.

One kind of phosphorescent material may be contained singly in the luminescent layer or two or more kinds of phosphorescent material may be contained simultaneously therein. The content of the phosphorescent material in the entire luminescent layer is preferably 0.1 mass % to 50 mass %, more preferably 0.5 mass % to 20 mass %, and still more preferably 1 mass % to 10 mass %.

In the luminescent layer of the invention, the concentration of the phosphorescent material contained in the luminescent layer changes periodically in the depth direction of the luminescent layer. The depth direction of the luminescent layer is a direction vertical to the formed surface of the luminescent layer. The concentration of the phosphorescent material in the luminescent layer changes periodically only in the depth direction. Preferably, in the horizontal direction, the concentration does not change and remains constant.

The periodic changes of the concentration of the phosphorescent material may be either continuous changes (with, for example, the concentration gradient of the phosphorescent material in the luminescent layer changing by gradation) or stepwise changes (with, for example, a layer having a phosphorescent material concentration of 3 mass % being adjacent to a layer having a phosphorescent material concentration of 7 mass %). In the invention, the concentration changes of the phosphorescent material are preferably stepwise changes.

The changes of concentration of the phosphorescent material may be changes of the concentration of one luminescent material only. When a plurality of phosphorescent materials are used simultaneously, the changes of the concentration may also be changes of the combined concentration of these phosphorescent materials. The periodic changes of the concentration are preferably periodic changes of the concentration of one luminescent material.

The number of cycles of the periodic changes of the concentration of the phosphorescent material is preferably 1 to 20, more preferably 2 to 15, and still more preferably 3 to 10.

The number of cycles of the periodic changes is counted as follows: for example, if there is a layer of 7 mass % of the phosphorescent material concentration on a layer of 3 mass % of the phosphorescent material concentration, which is on a further layer of 7 mass % of the phosphorescent material concentration on a layer of 3 mass % of the phosphorescent material concentration, the number of cycles of the periodic changes is two.

To achieve high efficiency in an organic electroluminescent device containing phosphorescent material represented by iridium phenyl pyridine complex (Ir (ppy)$_3$), it is reported that the luminescent material concentration in the luminescent layer should be approximately 7 mass %, which is different from an organic electroluminescent device containing a fluorescent luminescent material (concentration of approximately 1 mass %). However, since the phosphorescent material of iridium phenyl pyridine complex (Ir (ppy)$_3$) is high in hole transfer capacity, if the concentration is uniformly further heightened in the luminescent layer, holes penetrate through the electron transport layer, and the luminescent efficiency and durability are lowered.

In the invention, by changing the concentration of the phosphorescent material contained in the luminescent layer periodically in the depth direction of the luminescent layer, high efficiency of both luminescence and durability that could not be achieved in conventional organic electroluminescent devices can be successfully realized.

The luminescent layer of the invention is preferably a layer formed by alternately laminating a layer of high phosphorescent material concentration and a layer of low phosphorescent material concentration.

The layer of high phosphorescent material concentration and the layer of low phosphorescent material concentration each preferably have a thickness of 0.5 nm to 30 nm, more preferably 1 nm to 20 nm, and still more preferably 2 nm to 15 nm.

Further, the thickness of the layer of high phosphorescent material concentration is preferably greater than the thickness of the layer of low phosphorescent material concentration, and is preferably 1.5 times or more greater than the thickness of the layer of low phosphorescent material concentration, and more preferably 2 times or more greater.

The phosphorescent material concentration of the layer of high phosphorescent material concentration is preferably 4 mass % or more and 20 mass % or less, more preferably 4 mass % or more and 15 mass % or less, and still more preferably 4 mass % or more and 10 mass % or less.

The phosphorescent material concentration of the layer of low phosphorescent material concentration is preferably 0.1 mass % or more and less than 4 mass %, more preferably 0.5 mass % or more and less than 4 mass %, and still more preferably 1 mass % or more and less than 3 mass %.

The luminescent layer of the invention is preferably a layer formed by alternately vapor-depositing a layer of high phosphorescent material concentration and a layer of low phosphorescent material concentration.

The host material is a compound having the functions of charge transfer and the like in the luminescent layer of the organic electroluminescent device.

The host material used in the invention is not particularly specified. The host material is preferably a condensed ring aromatic compound, a distyryl arylene compound, an oligoarylene compound, an aromatic nitrogen-containing heterocyclic compound, a sulfur-containing heterocyclic compound, a metal complex, an oxo-substituted heterocyclic compound, an organic silicon compound, or a triaryl amine compound, more preferably a nitrogen-containing heterocyclic compound, an oligoarylene compound, or a metal complex, and still more preferably a nitrogen-containing heterocyclic compound or a metal complex.

As the host material, the host materials disclosed in, for example, JP-A No. 2002-100476 and JP-A No. 2003-27048, the disclosures of which are incorporated by reference herein, may be favorably used.

The blending ratio of phosphorescent material and the host material in the luminescent layer is preferably 1:100 to 1:1 by mass, more preferably 1:500 to 1:5, and still more preferably 1:100 to 1:10.

The organic electroluminescent device of the invention is structured such that at least one organic compound layer including the above-described luminescent layer is provided between a pair of electrodes. Preferably, the device comprises at least three layers, that is, a hole transport layer, a luminescent layer, and an electron transport layer, and more preferably the device comprises at least four layers, namely, a hole injecting layer, a hole transport layer, a luminescent layer, and an electron transport layer. Further, between the luminescent layer and the electron transport layer, one layer of a hole blocking layer or an exciton blocking layer may be provided.

The compound for forming the electron transport layer is preferably a metal complex, a nitrogen-containing heterocyclic compound, or an aromatic hydrocarbon compound, more preferably a metal complex or a nitrogen-containing heterocyclic compound, still more preferably a nitrogen-containing heterocyclic compound, and particularly preferably a 5,6-condensed ring nitrogen-containing heterocyclic compound (for example, benzimidazole, benzoxazole, purine, or imidazopyridine).

The compound for forming the hole transport layer is not particularly specified. The compound for forming the hole transport layer is preferably an amine derivative, a thiophene derivative, or an aromatic hydrocarbon compound, more preferably an amine derivative, still more preferably a triarylamine derivative, and particularly preferably a triarylamine derivative having a condensed hydrocarbon ring.

The hole injecting layer is not particularly specified. The hole injecting layer is preferably a layer containing a metal complex, a triarylamine derivative or a hydrocarbon fluoride compound, and more preferably a layer containing a metal complex, still more preferably a layer containing a phthalocyanine metal complex or a porphyrin metal complex, and particularly preferably a layer containing a copper phthalocyanine or a derivative thereof.

The hole blocking layer or electron transport layer is preferably a layer containing a nitrogen-containing heterocyclic compound or a metal complex, more preferably a layer containing a 5,6-condensed ring nitrogen-containing heterocyclic compound or a metal complex, and still more preferably a layer containing a 5,6-condensed ring nitrogen-containing heterocyclic compound.

The ionization potential of the host material contained in the luminescent layer of the invention is preferably 5.5 eV to 6.3 eV, and more preferably 5.6 eV to 6.0 eV.

The electron mobility of the host material in the organic electroluminescent device of the invention is preferably $1 \times 10^{-6}$ cm$^2$/Vs to $1 \times 10^{-1}$ cm$^2$/Vs, more preferably $5 \times 10^{-6}$ cm$^2$/Vs to $1 \times 10^{-2}$ cm$^2$/Vs, still more preferably $1 \times 10^{-5}$ cm$^2$/Vs to $1 \times 10^{-2}$ cm$^2$/Vs, and particularly preferably $5 \times 10^{-5}$ cm$^2$/Vs to $1 \times 10^{-2}$ cm$^2$/Vs.

The hole mobility of the host material in the organic electroluminescent device of the invention is preferably $1 \times 10^{-6}$ cm²/Vs to 1×10⁻¹ cm²/Vs, more preferably 5×10⁻⁶ cm²/Vs to 1×10⁻² cm²/Vs, still more preferably 1×10⁻⁵ cm²/Vs to 1×10⁻² cm²/Vs, and particularly preferably 5×10⁻⁵ cm²/Vs to 1×10⁻² cm²/Vs.

In the invention, the glass transition point of the host material contained in the luminescent layer, the compound forming the electron transport layer, and the hole transfer material is preferably 90° C. to 400° C., more preferably 100° C. to 380° C., still more preferably 120° C. to 370° C., and particularly preferably 140° C. to 360° C.

One of the preferred embodiments of the luminescent layer of the invention is formed by alternate vapor deposition, and the luminescent layer formed by alternate vapor deposition is preferably formed by a process including the following steps (1a) to (1c).

(1a) The host material and the luminescent material (high concentration) are co-vapor-deposited. Here, vapor deposition of the host material and the luminescent material (low concentration) is blocked by a shutter installed near the deposition source, and vapor deposition of the host material and luminescent material (low concentration) into the device during the process of manufacture is suppressed.

(1b) The host material and the luminescent material (low concentration) are vapor deposited. Here, vapor deposition of the host material and the luminescent material (high concentration) is blocked by a shutter installed near the deposition source, and vapor deposition of the host material and the luminescent material (high concentration) into the device during the process of manufacture is suppressed.

(1c) Steps (1a) and (1b) are repeated. The steps are switched over by opening or closing the shutter(s) installed near the deposition source.

The luminescent layer formed by alternate vapor deposition of the invention is also preferably formed by a process including the following steps (2a) to (2c).

(2a) The host material and the luminescent material (low concentration) are vapor-deposited. Here, vapor-deposition of the host material and the luminescent material (high concentration) is blocked by a shutter installed near the deposition source, and vapor deposition of the host material and the luminescent material (high concentration) into the device during the process of manufacture is suppressed.

(2b) The host material and the luminescent material (high concentration) are vapor-deposited. Here, vapor-deposition of the host material and the luminescent material (low concentration) is blocked by a shutter installed near the deposition source, and vapor-deposition of the host material and the luminescent material (low concentration) into the device during the process of manufacture is suppressed.

(2c) Steps (2a) and (2b) are repeated. The steps are switched over by opening or closing the shutter(s) installed near the deposition source.

Embodiments of the luminescent layer, the hole injecting layer, the hole transport layer, the luminescent layer, and the electron transport layer are explained herein, but the invention is not limited thereto. These layers are described in further detail below.

Compounds of the phosphorescent material of the invention are shown below (exemplary compounds (1-1) to (1-16)), but the invention is not limited thereto.

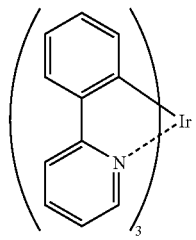

(1-1)

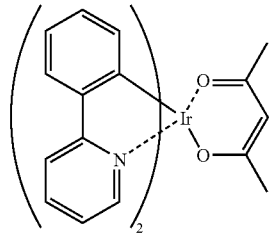

(1-2)

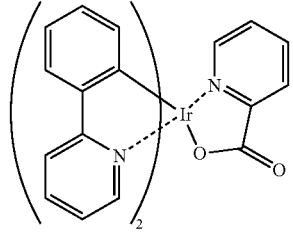

(1-3)

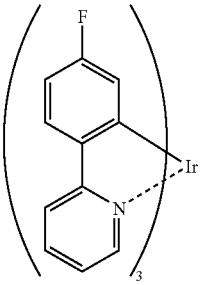

(1-4)

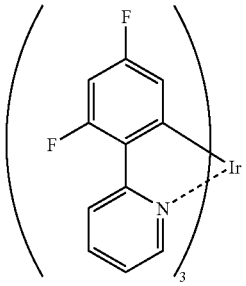

(1-5)

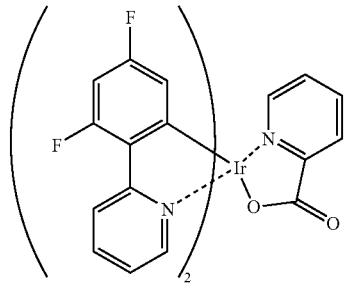

(1-6)

-continued
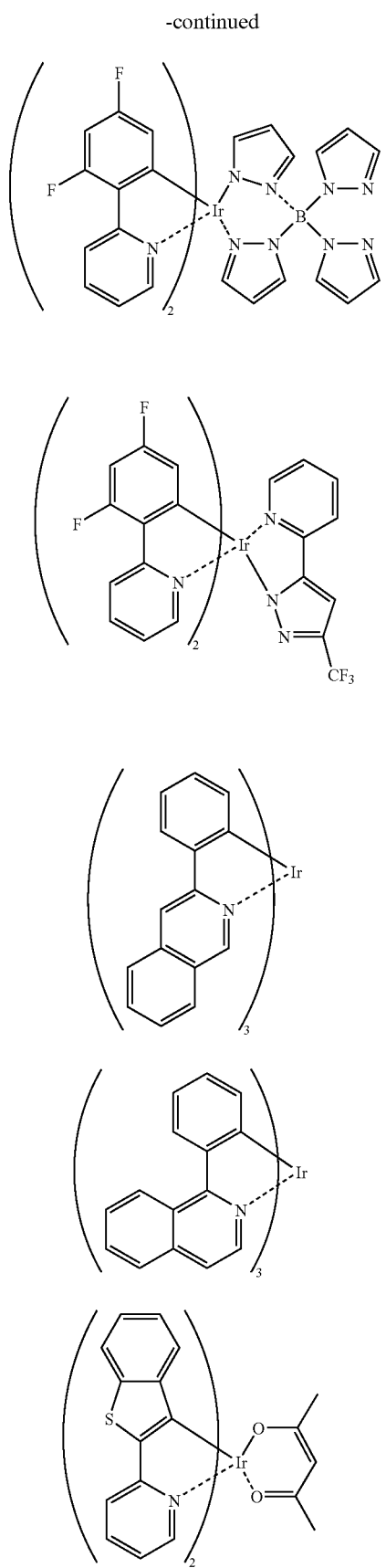
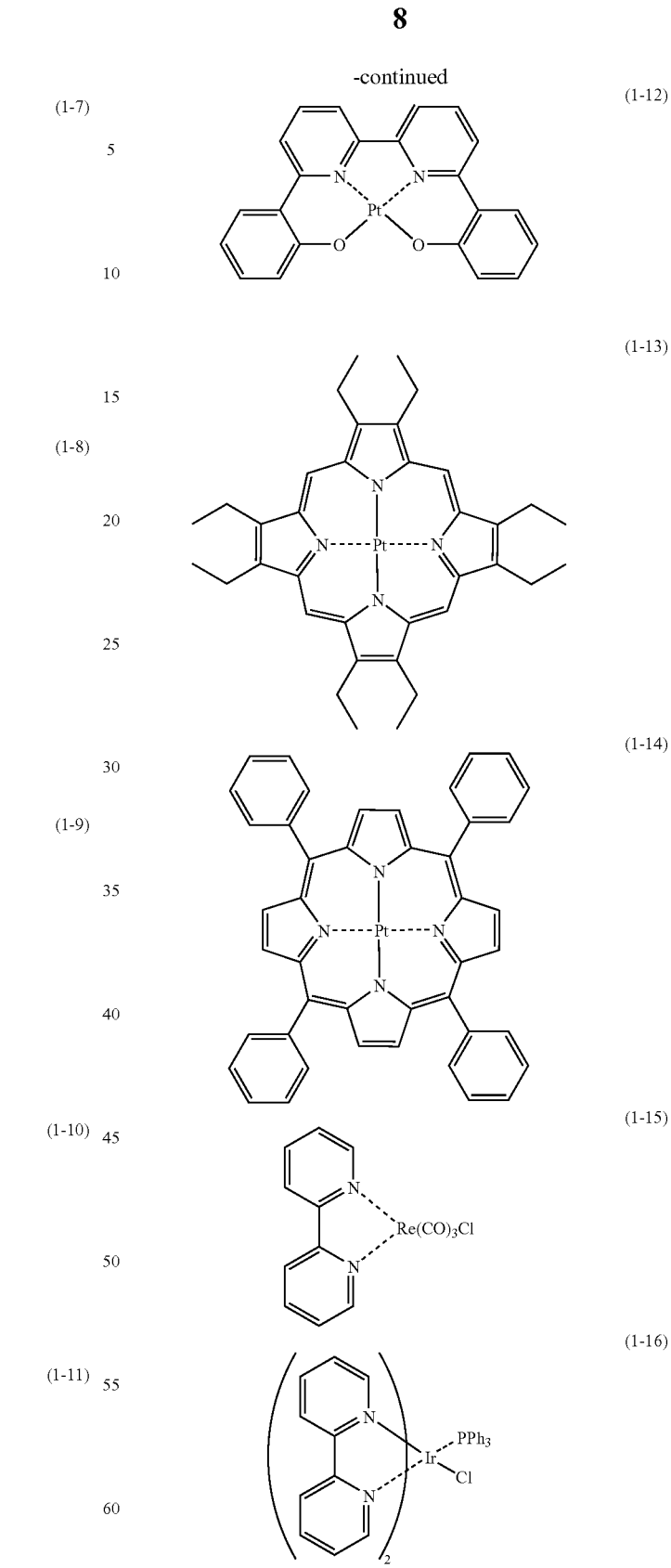
Examples of the host material of the invention (exemplary compounds (2-1) to (2-8)) are shown below, but the invention is not limited thereto.

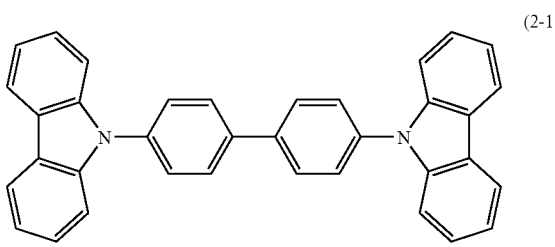
(2-1)

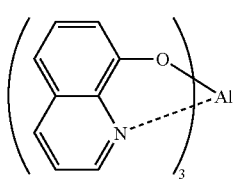
(2-2)

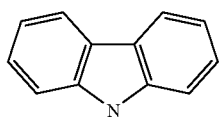
(2-3)

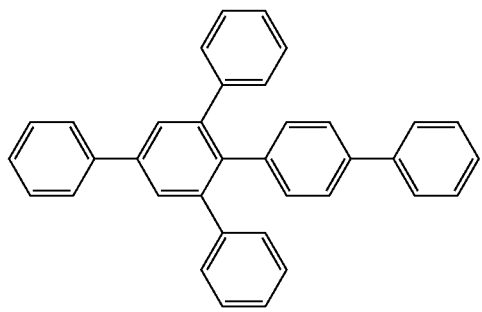
(2-4)

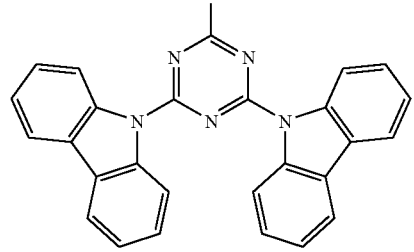
(2-5)

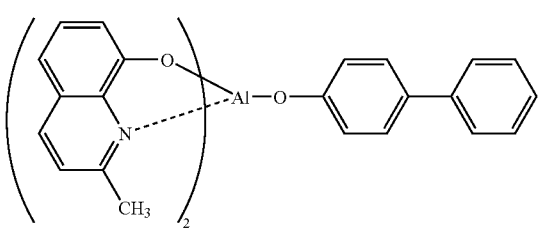
(2-6)

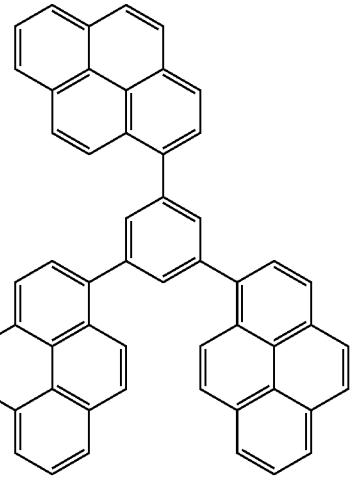
(2-7)

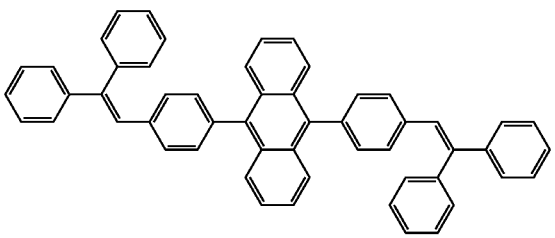
(2-8)

The organic electroluminescent device of the invention will be further explained. The system and the driving method for, and the usage of, the organic electroluminescent device are not particularly limited.

Light-extraction efficiency of the organic electroluminescent device of the invention can be improved by various known techniques. For example, light-extraction efficiency and external quantum efficiency can be improved by modifying a substrate surface profile (by, for example, formation of a finely irregular pattern), controlling the refractive indices of a substrate, an indium tin oxide (ITO) layer and an organic compound layer, or controlling the thicknesses of the substrate, the ITO layer and the organic compound layer.

The organic electroluminescent device of the invention may have a so-called top-emission structure (see, for example, Japanese Patent Application Laid-Open (JP-A) Nos. 2003-208109, 2003-248441, 2003-257651, and 2003-282261, the disclosures of which are incorporated by reference herein), in which luminescence is output from a negative electrode.

Examples of the base material of the organic electroluminescent device of the invention include, but are not limited to, inorganic materials such as yttrium stabilized with zirconium, and glass; polymeric materials including polyesters such as polyethylene terephthalate, polybutylene terephthalate and polyethylene naphthalate, polyethylene, polycarbonate, polyethersulfone, polyarylate, allyldiglycolcarbonate, polyimide, polycycloolefin, norbornene resins, poly(chloro-trifluoroethylene), TEFRON (polytetrafluoroethylene) and polytetrafluoroethylene-polyethylene copolymers.

The organic electroluminescent device may contain a blue fluorescent compound. Further, by using a blue luminescent device containing a blue fluorescent compound and the luminescent device of the invention simultaneously, a multicolor luminescent device or full color luminescent device may be manufactured.

The method for producing an organic compound layer of the organic electroluminescent device of the invention is not limited. Examples thereof include a resistance heating deposition method; an electron beam method; sputtering; a molecule-laminating method; a coating method such as a spray coating method, a dip coating method, an impregnating method, a roll coating method, a gravure coating method, a reverse coating method, a roll brushing method, an air knife coating method, a curtain coating method, a spin coating method, a flow coating method, a bar coating method, a micro gravure coating method, an air doctor coating method, a blade coating method, a squeeze coating method, a transfer roll coating method, a kiss coating method, a cast coating method, an extrusion coating method, a wire bar coating method, and a screen coating method; an ink-jet method; a printing method; and a transferring method. The production method is preferably a resistance heating deposition method, a coating method or a transferring method from the viewpoints of characteristics and production.

The organic electroluminescent device of the invention has, between a pair of positive and negative electrodes, at least one organic compound layer including a luminescent layer. The organic electroluminescent device may have a hole injecting layer, a hole transport layer, an electron injecting layer, an electron transport layer, and a protective layer, as well as the luminescent layer. Each of these layers may also have other functions. Various materials can be used to form each of these layers.

The positive electrode supplies holes to the hole injecting layer, the hole transport layer, and/or the luminescent layer. The positive electrode can be made from a metal, an alloy, a metal oxide, an electrically conductive compound, or a mixture thereof, and is preferably made of a material having a work function of 4 eV or more. Specific examples of the material of the positive electrode include electrically conductive metal oxides such as tin oxide, zinc oxide, indium oxide, and ITO; metals such as gold, silver, chromium, and nickel; mixtures and laminated products of these metals and the electrically conductive metal oxides; electrically conductive inorganic substances such as copper iodide, and copper sulfide; electrically conductive organic substances such as polyaniline, polythiophene, and polypyrrole; and laminated products of the electrically conductive organic substances and ITO. The material of the positive electrode is preferably an electrically conductive metal oxide. The material is more preferably ITO from the viewpoints of productivity, high electrical conductivity, transparency and the like. The thickness of the positive electrode can be suitably determined according to the material of the positive electrode, but is preferably 10 nm to 5 μm, more preferably 50 nm to 1 μm, and still more preferably 100 to 500 nm.

The positive electrode is usually an article having a layer of at least one of the above-described materials on a substrate made of soda lime glass, no-alkali glass, or a transparent resin. When the substrate is made of glass, the glass is preferably no-alkali glass in order to reduce ions deriving from the glass. When the substrate is made of soda lime glass, the substrate is preferably coated with a barrier coating such as silica. The thickness of the substrate is not limited, as long as the substrate has sufficient mechanical strength. However, when the substrate is made of glass, the thickness thereof is generally 0.2 mm or more, and preferably 0.7 mm or more.

A method for producing a positive electrode is selected according to the material of the positive electrode. When the positive electrode is an ITO film, the ITO film may be formed by an electron beam method, a sputtering method, a resistance heating deposition method, a chemical reaction method (e.g., a sol-gel method), or a method of applying a dispersion of indium tin oxide.

The positive electrode can be subjected to washing or other treatment to lower the driving voltage of the device and/or to enhance luminescence efficiency. When the positive electrode is made of ITO, for example, UV-ozone treatment or plasma treatment are effective.

The negative electrode supplies electrons to the electron injecting layer, the electron transport layer, and/or the luminescent layer, and the material of the negative electrode is selected in consideration of adhesion between the negative electrode and a layer adjacent to the negative electrode, such as the electron injecting layer, the electron transport layer, and/or the luminescent layer, and ionization potential and stability of the material. The negative electrode can be made from a metal, an alloy, a metal halide, a metal oxide, an electrically conductive compound, or a mixture thereof. Specific examples of the material of the negative electrode include alkali metals such as lithium, sodium, potassium, and fluorides and oxides thereof; alkaline earth metals such as magnesium, calcium, and fluorides and oxides thereof; gold, silver, lead, aluminum, a sodium-potassium alloy, and mixed metals of these materials; a lithium-aluminum alloy and mixed metals including the lithium-aluminum alloy; a magnesium-silver alloy and mixed metals including the magnesium-silver alloy; and rare earth metals such as indium and ytterbium. The negative electrode is preferably made of a material selected from the above materials and has a work function of 4 eV or less. The material of the negative electrode is more preferably aluminum, a lithium-aluminum alloy or a mixed metal including the lithium-aluminum alloy, or a magnesium-silver alloy or a mixed metal including the magnesium-silver alloy. The negative electrode can be one layer of any of the above-described materials or multilayers including one or more of the above-described materials. For example, the negative electrode preferably has a layered structure of aluminum/lithium fluoride, or aluminum/lithium oxide. The thickness of the negative electrode can be suitably determined according to the material of the negative electrode. However, the thickness is preferably 10 nm to 5 μm, more preferably 50 nm to 1 μm, and still more preferably 100 nm to 1 μm.

The negative electrode is formed by an electron beam method, a sputtering method, a resistance heating deposition method, a coating method, or a transferring method. One metal can be vapor-deposited, or at least two metals can be vapor-deposited simultaneously. In order to form an alloy electrode, at least two metals can be vapor-deposited simultaneously, or an alloy prepared in advance can be vapor-deposited.

The sheet resistance of each of the positive and negative electrodes is preferably low, and, specifically, is preferably several hundred ohm/sq or less.

The materials of the luminescent layer may be materials that can form a layer having a function of receiving holes from the positive electrode, the hole injecting layer or the hole transport layer and receiving electrons from the negative electrode, the electron injecting layer, or the electron transport layer when voltage is applied to the device, a function of transferring the received electrons, or a function of providing a field where holes are recombined with electrons to emit light.

The luminescent layer of the invention includes a phosphorescent material as an essential component. The luminescent layer of the invention may further include materials other than phosphorescent materials as long as the effect of the invention can be maintained. Examples thereof include benzoxazole, benzimidazole, benzothiazole, styrylbenzene, polyphenyl, diphenylbutadiene, tetraphenylbutadiene, naphthalimide, coumarin, perylene, perynone, oxadiazole, aldazine, pyralidine, cyclopentadiene, bisstyrylanthracene, quinacridone, pyrrolopyridine, thiadiazolopyridine, styrylamine, aromatic dimethylidyne compounds, metal complexes including metal complexes and rare earth metal complexes of 8-quinolinol, polymeric compounds including polythiophene, polyphenylene, polyphenylene vinylene, organic silane, iridium trisphenylpyridine complex, and transition metal complexes including platinum porphyrin complex, and derivatives thereof.

The thickness of the luminescent layer is not specifically limited, but is generally in a range of 1 nm to 5 μm, more preferably in a range of 5 nm to 1 μm, and still more preferably in a range of 10 nm to 500 nm. In the case of a luminescent layer composed by alternately laminating a layer of a high phosphorescent material and a layer of low phosphorescent material, a preferable thickness of each layer is as specified above.

A method for forming a luminescent layer is not particularly limited. Examples of the method include, but are not limited to, resistance heating deposition, an electron beam method, spattering, a molecule-laminating method, a coating method, an ink-jet method, a printing method, an LB method and a transferring method. The method is preferably resistance heating deposition or a coating method.

The most preferable method for forming the luminescent layer of the invention is, as mentioned above, a forming method by alternately vapor-depositing a layer of high phosphorescent material and a layer of low phosphorescent material.

As mentioned above, in the luminescent layer of the invention the concentration of the phosphorescent material changes periodically in the depth direction of the luminescent layer. Such a luminescent layer may be formed of a single compound, or a plurality of compounds. When formed of a single compound, the luminescent layer is formed of a phosphorescent material alone.

There may be one or plural luminescent layers, and each layer may emit light in different colors and, for example, white light may be emitted. A single luminescent layer may emit white light. In the case of plural luminescent layers, each luminescent layer may be formed of one material, or formed of plural compounds.

In the case of plural luminescent layers, any one layer may be a luminescent layer of the invention, or all layers may be luminescent layers of the invention, and preferably all layers are luminescent layers of the invention.

The materials of the hole injecting layer and hole transport layer may have one of a function for receiving holes from a positive electrode, a function for transporting holes and a function for blocking electrons injected from a negative electrode. Specific examples thereof include carbazole, triazole, oxazole, oxadiazole, imidazole, polyarylalkane, pyrazoline, pyrazolone, phenylenediamine, arylamine, amino-substituted chalcone, styrylanthracene, fluorenone, hydrazone, stilbene, silazane, an aromatic tertiary amine compound, a styrylamine compound, an aromatic dimethylidyne compound and a porphyrin compound; a polysilane compound, poly(N-vinylcarbazole), an aniline copolymer, electroconductive polymers or oligomers such as thiophene oligomer and polythiophene; organic silanes; carbon films; and derivatives thereof.

The thickness of each of the hole injecting layer and the hole transport layer is not specifically limited, but is preferably in a range of 1 nm to 5 μm, more preferably 5 nm to 1 μm, and still more preferably 10 nm to 500 nm. Each of the hole injecting layer and the hole transport layer may have a monolayered structure including one or more of the above-mentioned materials, or a multilayered structure including multiple layers having the same composition or different compositions.

The hole injecting layer and the hole transport layer are formed by a vacuum deposition method, an LB method, a method in which a hole injecting or transport material is dissolved or dispersed in a solvent and the resultant coating solution is applied to a substrate or any other layer, an inkjet method, a printing method, or a transferring method. In the case of a coating method, the above-described material and a resin component may be dissolved or dispersed in a solvent. Examples of the resin component include polyvinyl chloride, polycarbonate, polystylene, polymetyl methacrylate, polybutyl methacrylate, polyester, polysulfone, polyphenylene oxide, polybutadiene, poly(N-vinylcarbazole), hydrocarbon resins, ketone resins, phenoxy resins, polyamide, ethylcellulose, vinyl acetate resins, ABS resins, polyurethane resins, melamine resins, unsaturated polyester resins, alkyd resins, epoxy resins, and silicone resins.

The materials of the electron injecting layer and the electron transport layer may have one of a function of receiving electrons from a negative electrode, a function of transporting elections, and a function of blocking holes injected from a positive electrode. Specific examples thereof include triazole, oxazole, oxadiazole, imidazole, fluorenone, anthraquinodimetane, anthrone, diphenylquinone, thiopyran dioxide, carbodiimide, fluorenylidene methane, distyrylpyrazine, aromatic tetracarboxlic acid anhydride such as naphthalene tetracarboxylic acid anhydride and perylene tetracarboxylic acid anhydride, phthalocyanine, metal complexes including metal complexes of 8-quinolinol, metal phthalocyanine and metal complexes with benzoxazole and/or benzothiazole ligands, organic silanes, and derivatives thereof.

As described above, the electron transport layer of the invention is preferably a layer containing a nitrogen-containing heterocyclic compound.

The thickness of each of the electron injecting layer and the electron transport layer is not specifically limited, but is preferably in a range of 1 nm to 5 μm, more preferably 5 nm to 1 μm, and still more preferably 10 nm to 500 nm. Each of the electron injecting layer and the electron transport layer may have a monolayered structure including one or more of the above-mentioned materials, or a multilayered structure with multiple layers having the same composition or different compositions.

The electron injecting layer and the electron transport layer are formed by a vacuum deposition method, an LB method, a method in which an electron injecting or transport material is dissolved or dispersed in a solvent and the resultant coating solution is applied to a substrate or any other layer, an ink-jet method, a printing method, or a transferring method. In the case of a coating method, the above-described material and a resin component may be dissolved or dispersed in a solvent. Examples of the resin component include those exemplified above as the resin component which is dissolved or dispersed in a solvent together with the hole injecting or transport material.

The material of the protective layer may have a function of preventing substances that accelerate deterioration of the device, such as moisture and oxygen, from entering the device. Specific examples thereof include metals such as In, Sn, Pb, Au, Cu, Ag, Al, Ti, and Ni; metal oxides such as MgO, SiO, $SiO_2$, $Al_2O_3$, GeO, NiO, CaO, BaO, $Fe_2O_3$, $Y_2O_3$, and $TiO_2$; metal fluorides such as $MgF_2$, LiF, $AlF_3$, and $CaF_2$; nitrides such as $SiN_x$, and $SiO_xN_y$; polyethylene, polypropylene, polymethyl methacrylate, polyimide, polyurea, polytetrafluoroethylene, polychloro-trifluoroethylene, polydichloro-difluoroethylene, a chloro-trifluoroethylene/ dichloro-difluoroethylene copolymer, a copolymer obtained by copolymerizing a monomer mixture including tetrafluoroethylene and at least one comonomer, fluorinated copolymers having a ring structure in the main chain of the copolymer, water-absorbing substances having a coefficient of water absorption of at least 1%, and moisture-preventive substances having a coefficient of water absorption of at most 0.1%.

A method for forming a protective layer is not particularly limited. Examples thereof include a vacuum deposition method, a sputtering method, a reactive sputtering method, a molecular beam epitaxy (MBE) method, a cluster ion beam method, an ion-plating method, a plasma polymerization method (radio frequency excitation ion-plating method), a plasma CVD method, a laser CVD method, a thermal CVD method, a gas source CVD method, a coating method, a printing method, and a transferring method.

Applications of the organic electroluminescent device of the invention are not particularly limited. The organic electroluminescent device of the invention can be suitably used in the fields of display devices, displays, backlights, electrophotography, light sources for illumination, light sources for recording, light sources for exposure, light sources for reading, signs, sign boards, interiors, and optical communications.

EXAMPLES

The organic electroluminescent device of the invention is described in more detail below with reference to embodiments thereof, but it must be noted that the invention is not limited to these examples alone.

Comparative Example 1

A washed ITO substrate was put in a vapor-deposition apparatus, and NPD (N,N'-di-α-naphthyl-N,N'-diphenyl)-benzidine) was vapor-deposited thereon to a thickness of 40 nm. Thereon, an exemplary compound (1-1) and an exemplary compound (2-1) were vapor-deposited at a ratio of 6:94 (by mass) to a thickness of 30 nm. Further, BCP (2,9-dimethyl-4,7-diphenyl-phenanthrolin) was vapor-deposited thereon to a thickness of 6 nm, and then Alq (tris (8-hydroxyquinoline) aluminum complex) was vapor-deposited thereon to a thickness of 20 nm. Magnesium and silver were further co-vapor-deposited at a molar ratio of 10:1.

Thus, the organic EL device of Comparative Example 1 was produced.

Using a Toyo Technica source measuring unit 2400, direct-current constant voltage was applied to the organic EL device thus obtained to emit light, and a green luminescent light was obtained, and at 100 cd/m², external quantum efficiency was 7%.

Example 1

A washed ITO substrate was put in a vapor-deposition apparatus, and NPD (N,N'-di-α-naphthyl-N,N'-diphenyl)-benzidine) was vapor-deposited thereon to a thickness of 40 nm. An exemplary compound (1-1) and an exemplary compound (2-1) were vapor-deposited thereon at a ratio of 6:94 (by mass) to a thickness of 8 nm. Further, the exemplary compound (1-1) and the exemplary compound (2-1) were vapor-deposited thereon at a ratio of 2:98 (by mass) to a thickness of 2 nm, and this cycle was repeated a further two times, and thus an alternately laminated luminescent layer with a total thickness of 30 nm was formed. Yet further, BCP (2,9-dimethyl-4,7-diphenyl-phenanthrolin) was vapor-deposited thereon to a thickness of 6 nm, and, further, Alq (tris (8-hydroxyquinoline) aluminum complex) was vapor-deposited thereon to a thickness of 20 nm. Magnesium and silver were further co-vapor-deposited thereon at a molar ratio of 10:1. Thus, an organic EL device of Example 1 was produced.

Using a Toyo Technica source measuring unit 2400, direct-current constant voltage was applied to the organic EL device thus obtained to emit light, and a green luminescent light was obtained, and at 100 cd/m², external quantum efficiency was 10%. The driving durability at 100 cd/m² was 2 times that of the device of Comparative Example 1.

Example 2

A washed ITO substrate was put in a vapor-deposition apparatus, and a copper phthalocyanine was vapor-deposited thereon to a thickness of 20 nm, and, further, NPD (N,N'-di-α-naphthyl-N,N'-diphenyl)-benzidine) was vapor-deposited thereon to a thickness of 40 nm. An exemplary compound (1-1) and an exemplary compound (2-1) were vapor-deposited thereon at a ratio of 2:34 (by mass) to a thickness of 8 nm, and an exemplary compound (1-1) and an exemplary compound (2-1) were vapor-deposited thereon at a ratio of 2:98 (by mass) to a thickness of 2 nm, and this cycle was repeated a further three times, and thus an alternately laminated luminescent layer with a total thickness of 40 nm was formed. Moreover, BAlq (see structure below) was vapor-deposited thereon to a thickness of 15 nm, and, further, Alq was vapor-deposited thereon to a thickness of 20 nm. Magnesium and silver were further co-vapor-deposited thereon at a molar ratio of 10:1. Thus, an organic EL device of Example 2 was produced.

Using a Toyo Technica source measuring unit 2400, direct-current constant voltage was applied to the organic EL device thus obtained to emit light, and a green luminescent light was obtained, and at 100 cd/m², external quantum efficiency was 10%. The driving durability at 100 cd/m² was 20 times that of the device of Comparative Example 1.

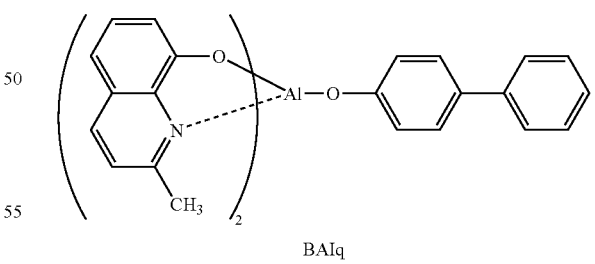

BAlq

Example 3

A washed ITO substrate was put in a vapor-deposition apparatus, and a copper phthalocyanine was vapor-deposited thereon to a thickness of 20 nm, and, further, NPD (N,N'-di-α-naphthyl-N,N'-diphenyl)-benzidine) was vapor-deposited thereon to a thickness of 40 nm. An exemplary compound (1-1) and an exemplary compound (2-1) were vapor-deposited thereon at a ratio of 2:34 (by mass) to a thickness of 8 nm, and an exemplary compound (1-1) and an exemplary compound (2-1) were vapor-deposited thereon at a ratio of 2:98 (by mass) to a thickness of 2 nm, and this cycle was repeated a further three times, and thus an alternately laminated luminescent layer with a total thickness of 40 nm was formed. Moreover, Compound A was vapor-deposited thereon to a thickness of 36 nm. Magnesium and silver were further co-vapor-deposited thereon at a molar ratio of 10:1. Thus, an organic EL device of Example3 was produced.

Using a Toyo Technica source measuring unit 2400, direct-current constant voltage was applied to the organic EL device thus obtained to emit light, and a green luminescent light was obtained, and at 100 cd/m², external quantum efficiency was 15%. The driving durability at 100 cd/m² was 10 times that of the device of Comparative Example 1.

Compound A

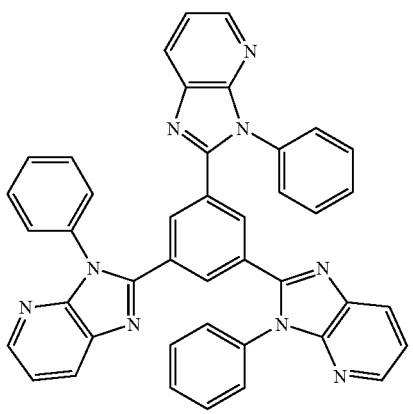

Example 4

A washed ITO substrate was put in a vapor-deposition apparatus, and a copper phthalocyanine was vapor-deposited thereon to a thickness of 20 nm, and, further, NPD (N,N'-di-α-naphthyl-N,N'-diphenyl)-benzidine) was vapor-deposited thereon to a thickness of 40 nm. An exemplary compound (1-4) and an exemplary compound (2-5) were vapor-deposited thereon at a ratio of 2:34 (by mass) to a thickness of 8 nm, and an exemplary compound (1-10) and an exemplary compound (2-6) were vapor-deposited thereon at a ratio of 2:98 (by mass) to a thickness of 2 nm, and this cycle was repeated a further three times, and thus an alternately laminated luminescent layer with a total thickness of 40 nm was formed. Moreover, Compound A was vapor-deposited thereon to a thickness of 36 nm. Magnesium and silver were further co-vapor-deposited thereon at a molar ratio of 10:1. Thus, an organic EL device of Example 4 was produced.

Using a Toyo Technica source measuring unit 2400, direct-current constant voltage was applied to the organic EL device thus obtained to emit light, and a green luminescent light was obtained, and at 100 cd/m², external quantum efficiency was 5%. The driving durability at 100 cd/m² was 2 times that of the device of Comparative Example 1.

As described above, it was found that the organic electroluminescent device of the invention is high in quantum efficiency of light emission, and excellent in durability. Further, the organic electroluminescent device of the invention is also high in quantum efficiency of light emission, and excellent in durability if manufactured using host materials or luminescent materials other than those used in the Examples.

Accordingly, the invention provides an organic electroluminescent device high in quantum efficiency of light emission, and excellent in durability.

What is claimed is:

1. An organic electroluminescent device comprising:
   a pair or electrodes; and
   at least one organic compound layer including a luminescent layer between the pair of electrodes,
   wherein the luminescent layer contains at least one host material and at least one phosphorescent material, and
   wherein the luminescent layer is a layer formed by alternately laminating a layer of high phosphorescent material concentration and a layer of low phosphorescent material concentration at least two times, and wherein the number of layers of high phosphorescent material concentration is at least two and the number of layers of low phosphorescent material concentration is at least two.

2. The organic electroluminescent device of claim 1, wherein the layers of high phosphorescent material concentration and the layers of low phosphorescent material concentration each have a thickness of 1 nm to 20 nm.

3. The organic electroluminescent device of claim 1, wherein the phosphorescent material concentration of each layer of high phosphorescent material concentration is 4 mass % or more and 20 mass % or less and the phosphorescent material concentration of each layer of low phosphorescent material concentration is 0.1 mass % or more and less than 4 mass %.

4. The organic electroluminescent device of claim 2, wherein the phosphorescent material concentration of each layer of high phosphorescent material concentration is 4 mass % or more and 20 mass % or less and the phosphorescent material concentration of each layer of low phosphorescent material concentration is 0.1 mass % or more and less than 4 mass %.

5. The organic electroluminescent device of claim 1, wherein the luminescent layer is a layer formed by alternately vapor-depositing a layer of high phosphorescent material concentration and a layer of low phosphorescent material concentration.

6. The organic electroluminescent device of claim 2, wherein the luminescent layer is a layer formed by alternately vapor-depositing a layer of high phosphorescent material concentration and a layer of low phosphorescent material concentration.

7. The organic electroluminescent device of claim 3, wherein the luminescent layer is a layer formed by alternately vapor-depositing a layer of high phosphorescent material concentration and a layer of low phosphorescent material concentration.

8. The organic electroluminescent device of claim 4, wherein the luminescent layer is a layer formed by alternately vapor-depositing a layer of high phosphorescent material concentration and a layer of low phosphorescent material concentration.

9. The organic electroluminescent device of claim 1, further comprising an electron transport layer containing a nitrogen-containing heterocyclic compound.

10. The organic electroluminescent device of claim 1, wherein the thickness of the layer of high phosphorescent material concentration is greater than the thickness of the layer of low phosphorescent material concentration.

11. The organic electroluminescent device of claim 1, wherein the thickness of the layer of high phosphorescent material concentration is at least 1.5 times greater than the thickness of the layer of low phosphorescent material concentration.

12. The organic electroluminescent device of claim 1, wherein the thickness of the layer of high phosphorescent material concentration is at least two times greater than the thickness of the layer of low phosphorescent material concentration.

* * * * *